(12) United States Patent
Lai

(10) Patent No.: US 8,069,893 B2
(45) Date of Patent: Dec. 6, 2011

(54) CUTTING MECHANISM FOR DRY FILM LAMINATOR

(76) Inventor: Chin-Sen Lai, Taichung (TW)

( * ) Notice: Subject to any disclaimer, the term of this patent is extended or adjusted under 35 U.S.C. 154(b) by 183 days.

(21) Appl. No.: 12/699,048

(22) Filed: Feb. 3, 2010

(65) Prior Publication Data

US 2011/0186232 A1 Aug. 4, 2011

(51) Int. Cl.
*B32B 37/00* (2006.01)
*B32B 38/04* (2006.01)
(52) U.S. Cl. ............... 156/517; 156/566; 156/556
(58) Field of Classification Search ............ 156/517, 156/521, 556, 566, 264, 270
See application file for complete search history.

(56) References Cited

U.S. PATENT DOCUMENTS

| 4,925,515 | A * | 5/1990 | Yoshimura et al. | 156/250 |
| 6,238,515 | B1 * | 5/2001 | Tsujimoto et al. | 156/379.8 |
| 6,689,245 | B2 * | 2/2004 | Tsujimoto | 156/267 |
| 2003/0131929 | A1 * | 7/2003 | Yamamoto | 156/250 |

* cited by examiner

*Primary Examiner* — Linda L Gray

(57) ABSTRACT

A cutting mechanism for dry film laminator includes a main base connected to a dry film laminator. The main base has a cutting space defined therein. The main base has two rollers disposed thereon and located beside the cutting space. The two rollers flatly guide a film above the cutting space. A film-carrying device is movably disposed on the main base. The film-carrying device includes a suction member movably disposed thereon. The suction member has at least one annular groove defined therein and corresponding to a shape of a wafer. A cutting device is movably disposed below the main base. The cutting device includes a film cutter movably disposed thereon. The cutting device includes an elevating device disposed thereon for moving the film cutter upward/downward. The cutting device includes a motor disposed thereon for rotating the film cutter.

7 Claims, 7 Drawing Sheets

CUTTING MECHANISM FOR DRY FILM LAMINATOR

BACKGROUND OF THE INVENTION

1. Field of the Invention

The present invention relates to a cutting mechanism for dry film laminator, and more particularly to a cutting mechanism which pre-cuts a film and laminates the film on a wafer.

2. Description of Related Art

A conventional trimming mechanism for semiconductor wafer in accordance with the prior art comprises a housing, a base received in the housing and horizontally disposed on an inner bottom of the housing, and an upper trimming device received in the housing. The upper trimming device is movably suspended from an inner top of the housing via multiple shafts and is able to move upwardly/downwardly relative to the housing. The upper trimming device includes an annular outer member, an annular inner member, and an annular blade mounted on a bottom thereof. A lower device is received in the housing. The lower device is disposed on a top of the base and corresponds to the upper trimming device for holding a wafer. A supply device is disposed beside the lower device for supplying a protecting film. A take-up device is disposed beside the lower device opposite the supply device for collecting the used protecting film.

When the upper trimming device is operated to move downwardly, the protecting film is laminated on the wafer. The annular blade trims the protecting film around the wafer. However, during trimming, the bleeding resin would not be removed clearly. And afterwards the wafer is moved to another stage for enhancing lamination. The resin may bleed out the wafer again. Therefore, the wafer fabrication may have a low yield.

The present invention has arisen to mitigate and/or obviate the disadvantages of the conventional trimming mechanism for semiconductor wafer.

SUMMARY OF THE INVENTION

The main objective of the present invention is to provide an improved cutting mechanism for dry film laminator.

To achieve the objective, the cutting mechanism for dry film laminator in accordance with the present invention includes a main base adapted to be connected to a dry film laminator. The main base has a cutting space defined therein and extending therethrough. A support base is disposed on a top of the main base for adapting to hold a wafer. The main base has two rollers disposed on the top thereof and oppositely located beside the cutting space.

A film supply device is disposed on a bottom of the main base. The film supply device includes a supply spool and a take-up spool disposed thereon and respectively corresponding to the two rollers. A film is wound on the supply spool and riding around the two rollers. The two rollers flatly guide the film above the cutting space. After cutting, the take-up spool winds the used film.

A film-carrying device is movably disposed on the top of the main base. The film-carrying device includes a suction member movably disposed thereon. The suction member has at least one annular groove concentrically defined in a bottom thereof and adapted to correspond to a shape of an outer peripheral edge of the wafer. The suction member has a plurality of air holes defined in the bottom thereof, such that the suction member sucks in air via the air holes and sucks the film guided above the cutting space. The film-carrying device includes a lifting device movably mounted thereon and connected to the suction member for moving the suction member upward/downward relative to the main base. The film-carrying device includes a swiveling device movably mounted thereon and swivelably connected to the lifting device for swivelably moving the suction member from the cutting space to the support base and vice versa.

A cutting device is movably disposed below the main base and corresponding to a location of the cutting space. The cutting device includes a film cutter movably disposed on a top thereof. The film cutter includes a blade movably mounted thereon. The film cutter includes a blade-angle adjuster mounted thereon and connected to the blade for varying an angle of the blade relative to the film cutter. The cutting device includes an elevating device movably disposed thereon and connected to the film cutter for moving the film cutter upward/downward through the cutting space relative to the main base. The cutting device includes a motor disposed thereon and connected to the elevating device for rotating the film cutter in the cutting space.

Accordingly, when the suction member moves downwardly above the cutting space and is adapted to suck the film guided above the cutting space, the film cutter is lifted by the elevating device and penetrates the film to be slightly confined by one of the at least one annular groove on the suction device. Sequentially the motor drives the film cutter to rotate along the annular groove for cutting the film. Afterwards the film cutter moves downwardly and separated from the annular groove. The suction member sucks the cut film and is moved from the cutting space to the wafer which held on the support base for releasing the cut film onto the wafer.

Further benefits and advantages of the present invention will become apparent after a careful reading of the detailed description with appropriate reference to the accompanying drawings.

DETAILED DESCRIPTION OF THE INVENTION

Figures 1, 1A:
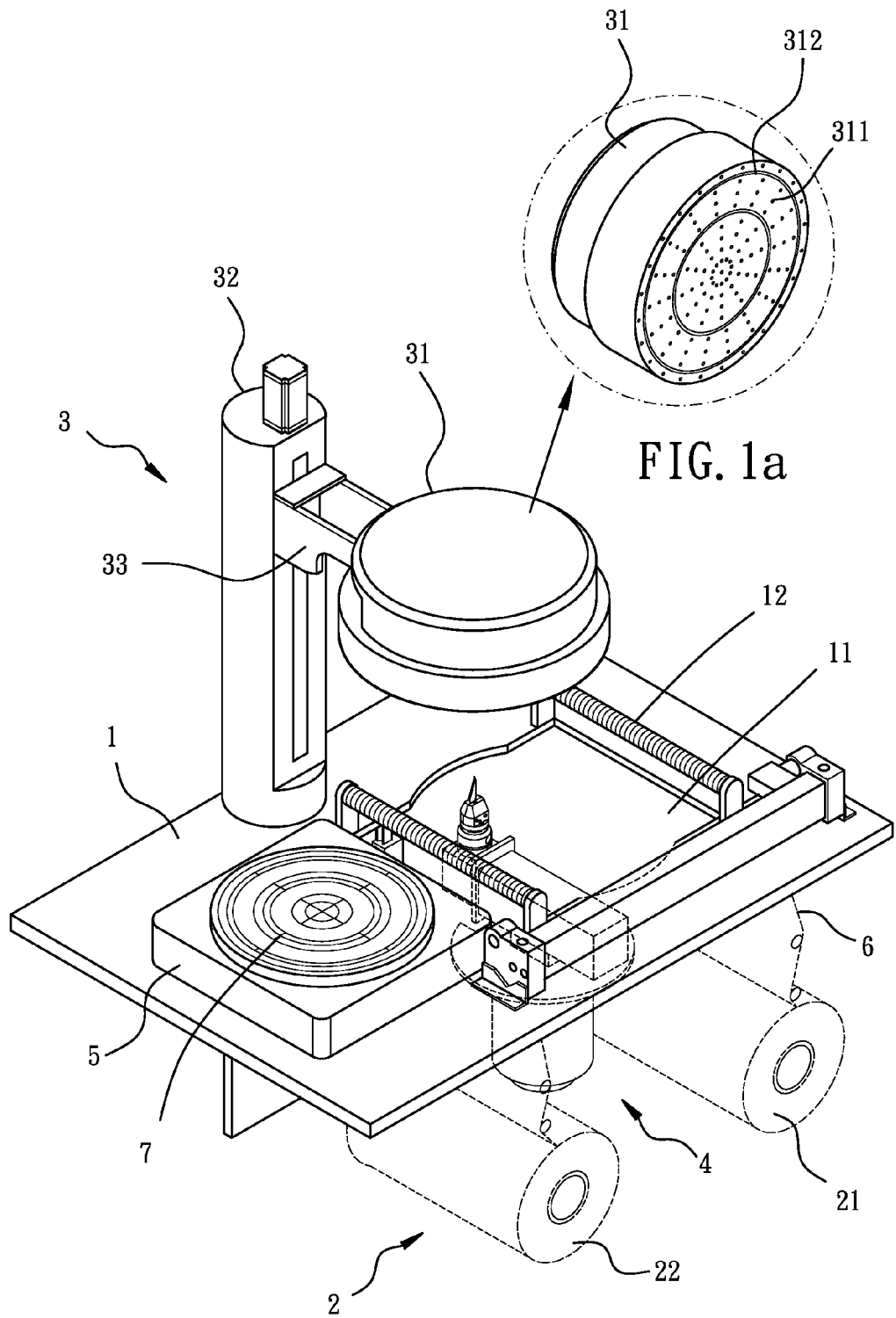
FIG. 1 is a perspective view of a cutting mechanism for dry film laminator in accordance with the present invention.
FIG. 1a is a perspective view of a suction member of the cutting mechanism for dry film laminator in accordance with the present invention.
Figure 2:
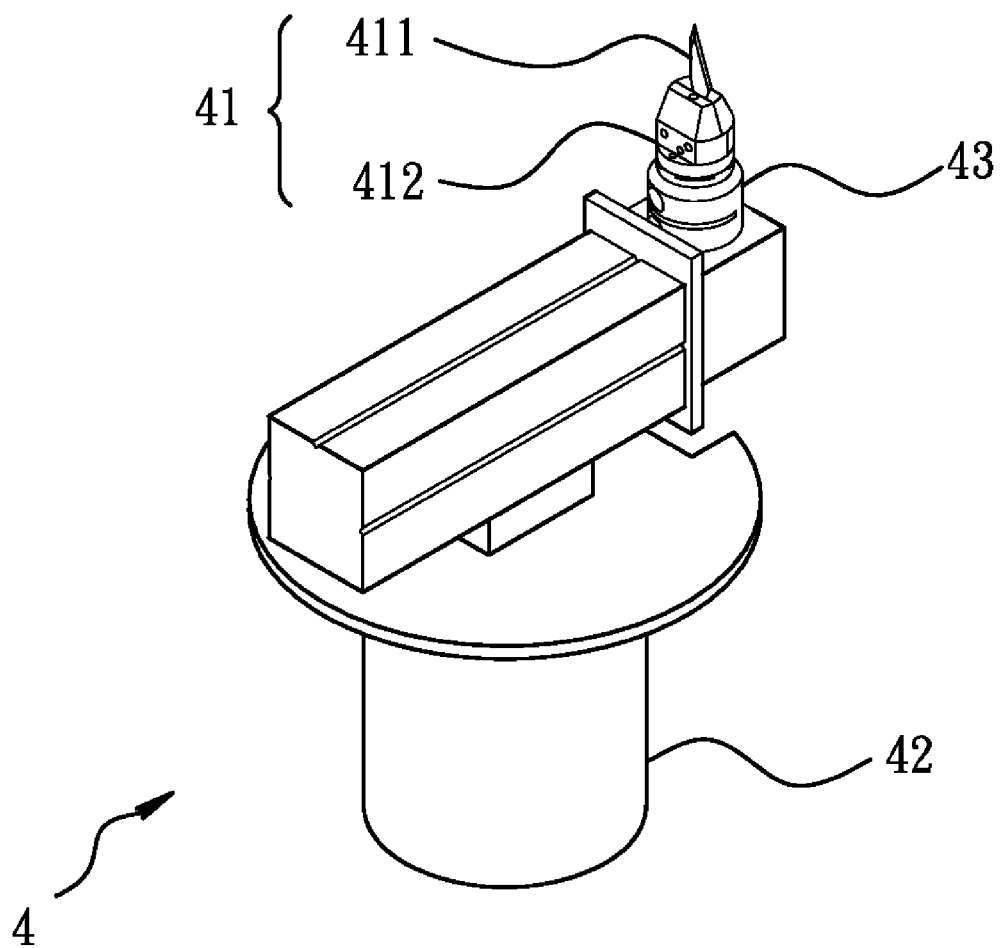
FIG. 2 is a perspective view of a cutting device of the cutting mechanism for dry film laminator in accordance with the present invention.

Referring to the drawings and initially to FIGS. 1-2, a cutting mechanism for dry film laminator in accordance with the present invention comprises a main base 1 adapted to be connected to a dry film laminator (not shown). The main base 1 has a cutting space 11 defined therein and extending therethrough. A support base 5 is disposed on a top of the main base 1 and located adjacent to the cutting space 11 for adapting to hold a wafer 7. The main base 1 has two rollers 12 disposed on the top thereof and oppositely located beside the cutting space 11.

A film supply device 2 is disposed on a bottom of the main base 1. The film supply device 2 includes a supply spool 21 and a take-up spool 22 disposed thereon and respectively corresponding to the two rollers 12. A film 6 is wound on the supply spool 21 and rides around the two rollers 12. The two rollers 12 flatly guide the film 6 above the cutting space 11. After cutting, the take-up spool 22 winds the used film 6.

A film-carrying device 3 is movably disposed on the top of the main base 1. The film-carrying device 3 includes a suction member 31 movably disposed thereon. The suction member 31 has at least one annular groove 312 concentrically defined in a bottom thereof. The at least one annular groove 312 can be in different sizes for corresponding to a shape of an outer peripheral edge of the wafer 7. The suction member 31 has a plurality of air holes 311 defined in the bottom thereof, such that the suction member 31 sucks in air via the air holes 311 and sucks the film 6 which is flatly guided above the cutting space 11. The film-carrying device 3 includes a lifting device 33 movably mounted thereon and connected to the suction member 31 for moving the suction member 31 upward/downward relative to the main base 1. The film-carrying device 3 includes a swiveling device 32 movably mounted thereon and swivelably connected to the lifting device 33 for swivelably moving the suction member 31 from the cutting space 11 to the support base 5 and vice versa.

Moreover, a cutting device 4 is movably disposed below the main base 1 and corresponds to a location of the cutting space 11. The cutting device 4 includes a film cutter 41 movably disposed on a top thereof for cutting the film 6 guided above the cutting space 11. The film cutter 41 includes a blade 411 movably mounted thereon and a blade-angle adjuster 412 which is mounted thereon and located below the blade 411. The blade-angle adjuster 412 is connected to the blade 411 and is able to vary an angle of the blade 411 relative to the film cutter 41 for easily making a V-shaped cut 61 (shown in FIGS. 8-9) in the film 6 which corresponds to a V-shaped cut (not shown) in the wafer 7. The cutting device 4 includes an elevating device 43 movably disposed thereon and connected to the film cutter 41 for moving the film cutter 41 upward/downward through the cutting space 11 relative to the main base 1. The cutting device 4 includes a motor 42 disposed thereon and connected to the elevating device 43 for driving the film cutter 41 to rotate in the cutting space 11.

Figure 3:
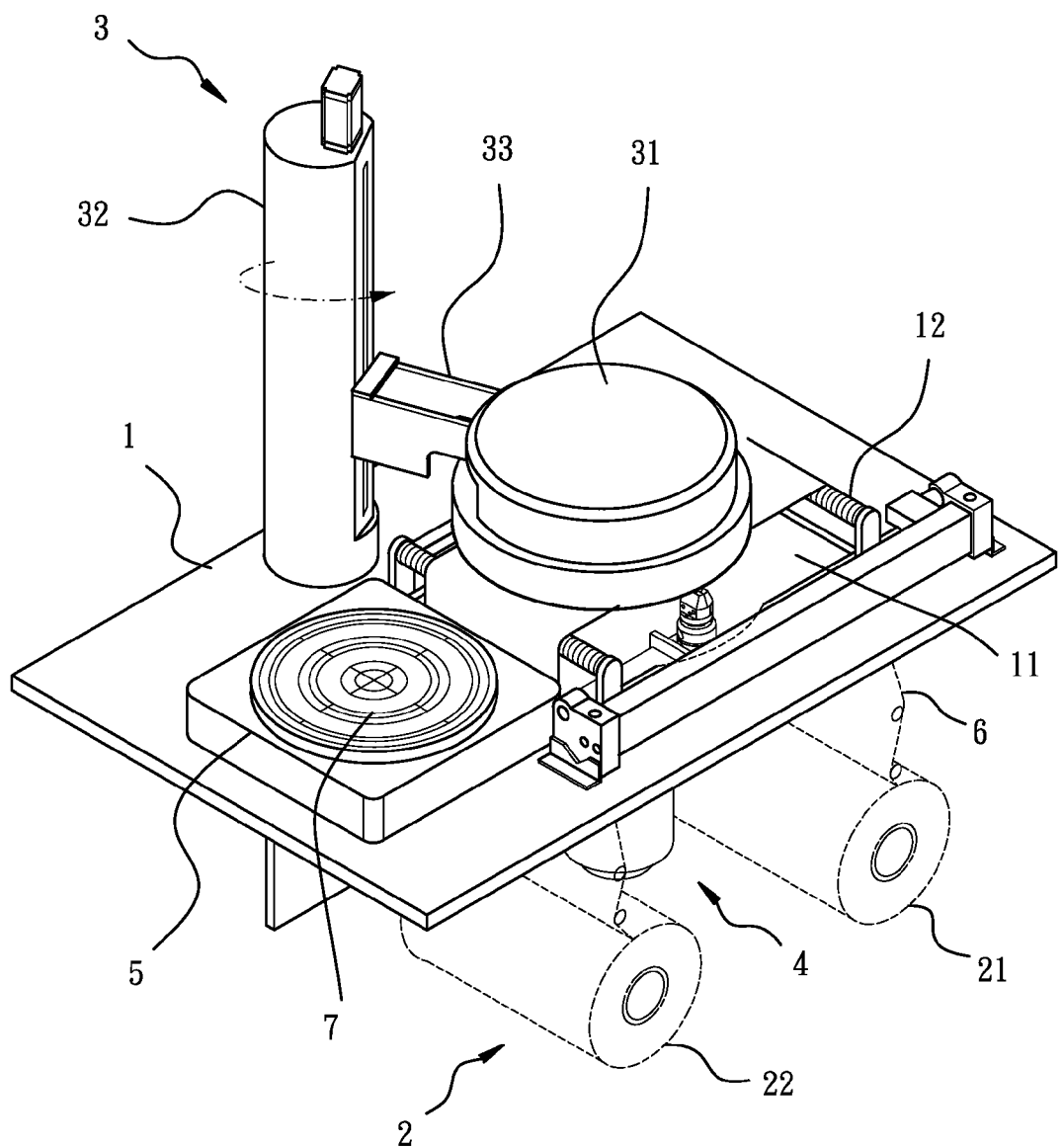
FIGS. 3-5 are operational perspective views of the cutting mechanism for dry film laminator in accordance with the present invention.
Figure 4:
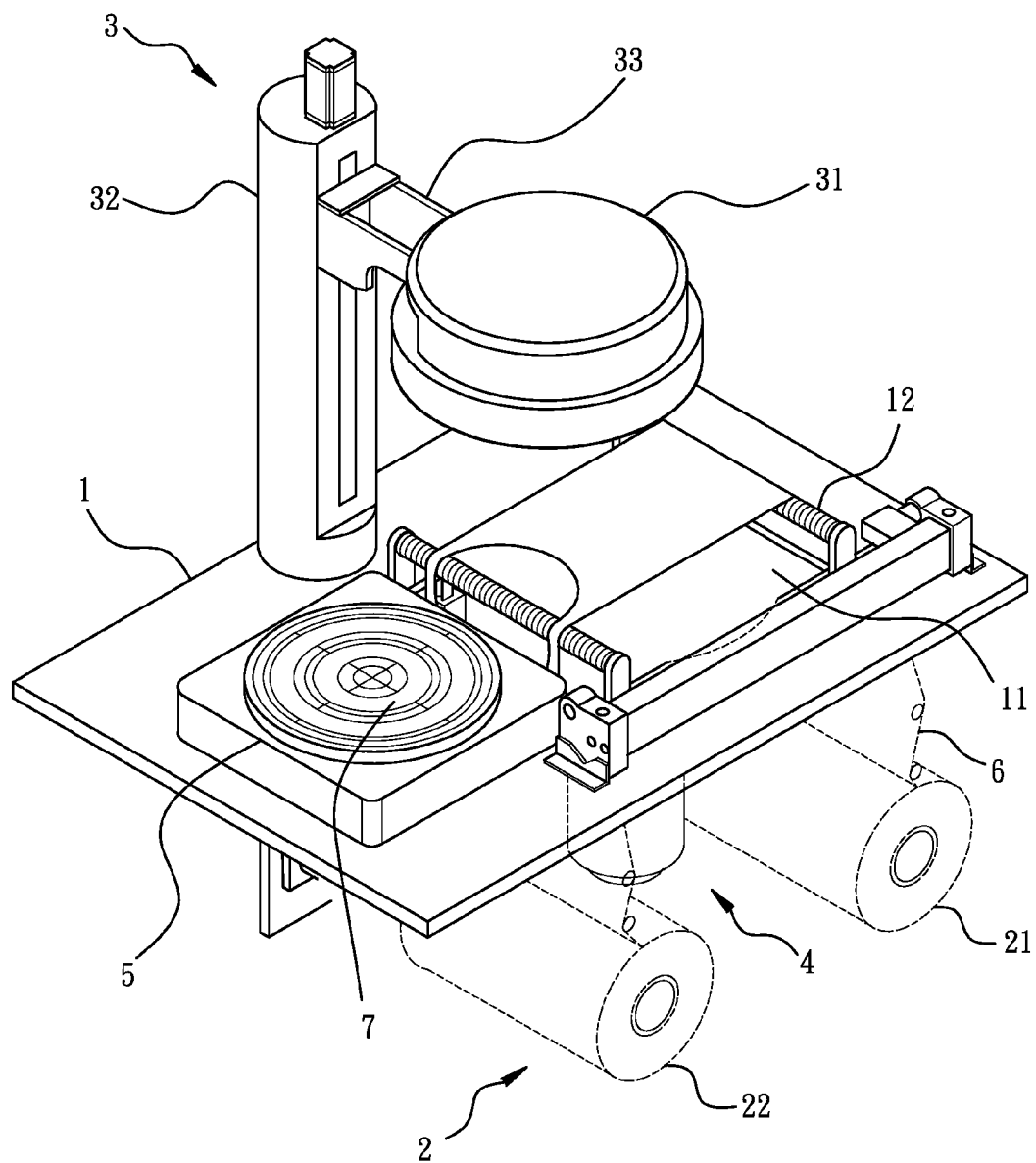
Figure 5:
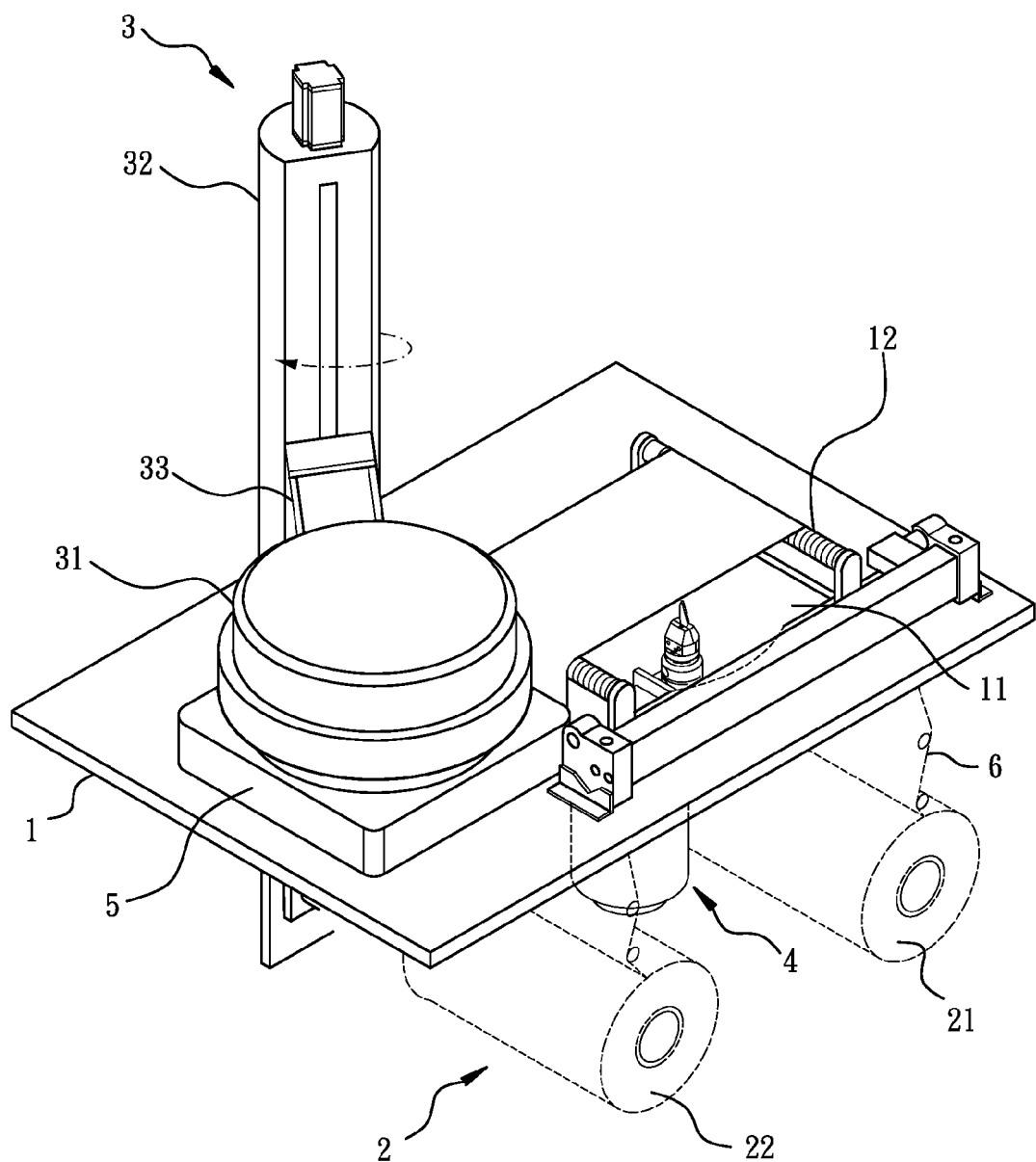
Figure 6:
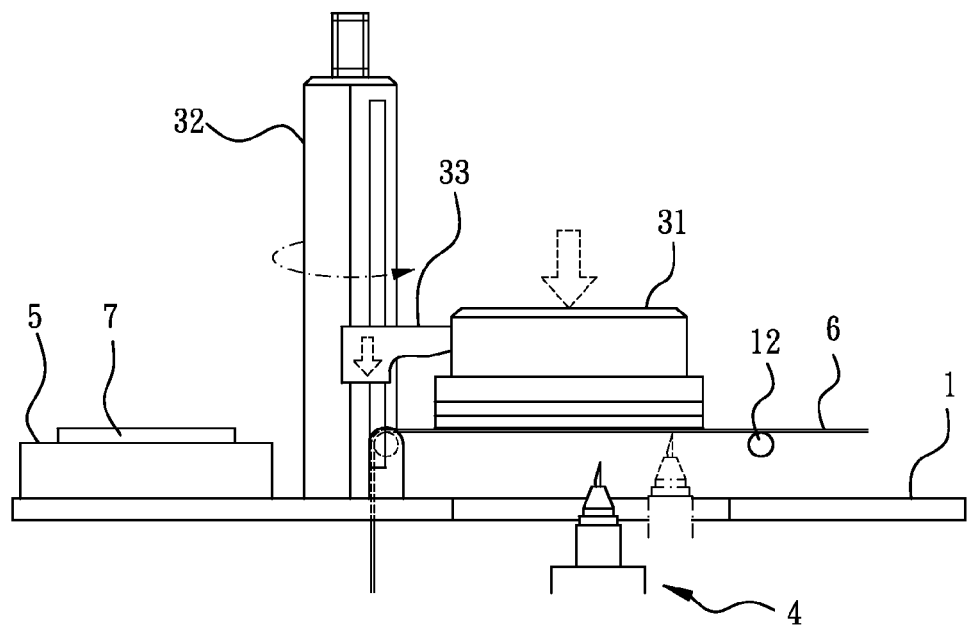
FIGS. 6-7 are operational plane views of the cutting mechanism for dry film laminator in accordance with the present invention, which respectively correspond to FIGS. 3 and 5.
Figure 7:
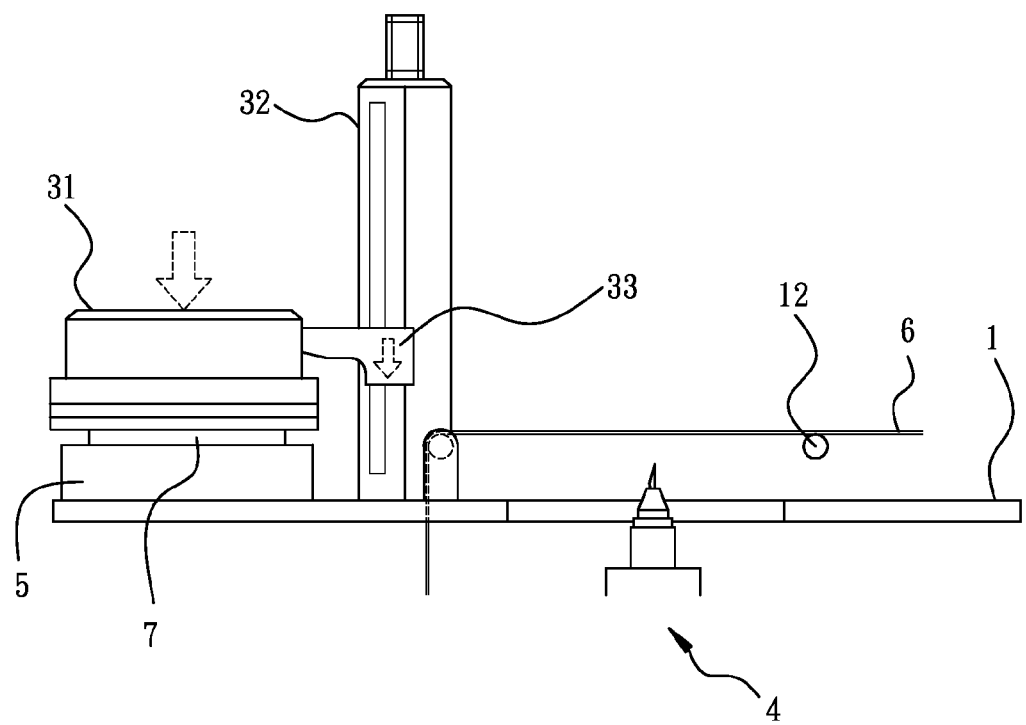

Accordingly, FIGS. 3-5 show the operation of the cutting mechanism for dry film laminator in accordance with the present invention. FIGS. 6-7 are side views which respectively correspond to FIGS. 3 and 5. The unused film 6 is supplied from the supply spool 21 and guided above the cutting space 11 by the two rollers 12. The swiveling device 32 swivels the suction member 31 to a position above the cutting space 11. The lifting device 33 moves the suction member 31 downwardly above the film 6 which is flatly guided above the cutting space 11. The suction member 31 sucks the film 6 to position the film 6. Sequentially, the film cutter 41 is lifted by the elevating device 43. The blade 411 penetrates the film 6 which is sucked by the suction member 31 to be slightly confined by one of the at least one annular groove 312.

Figures 8, 9:
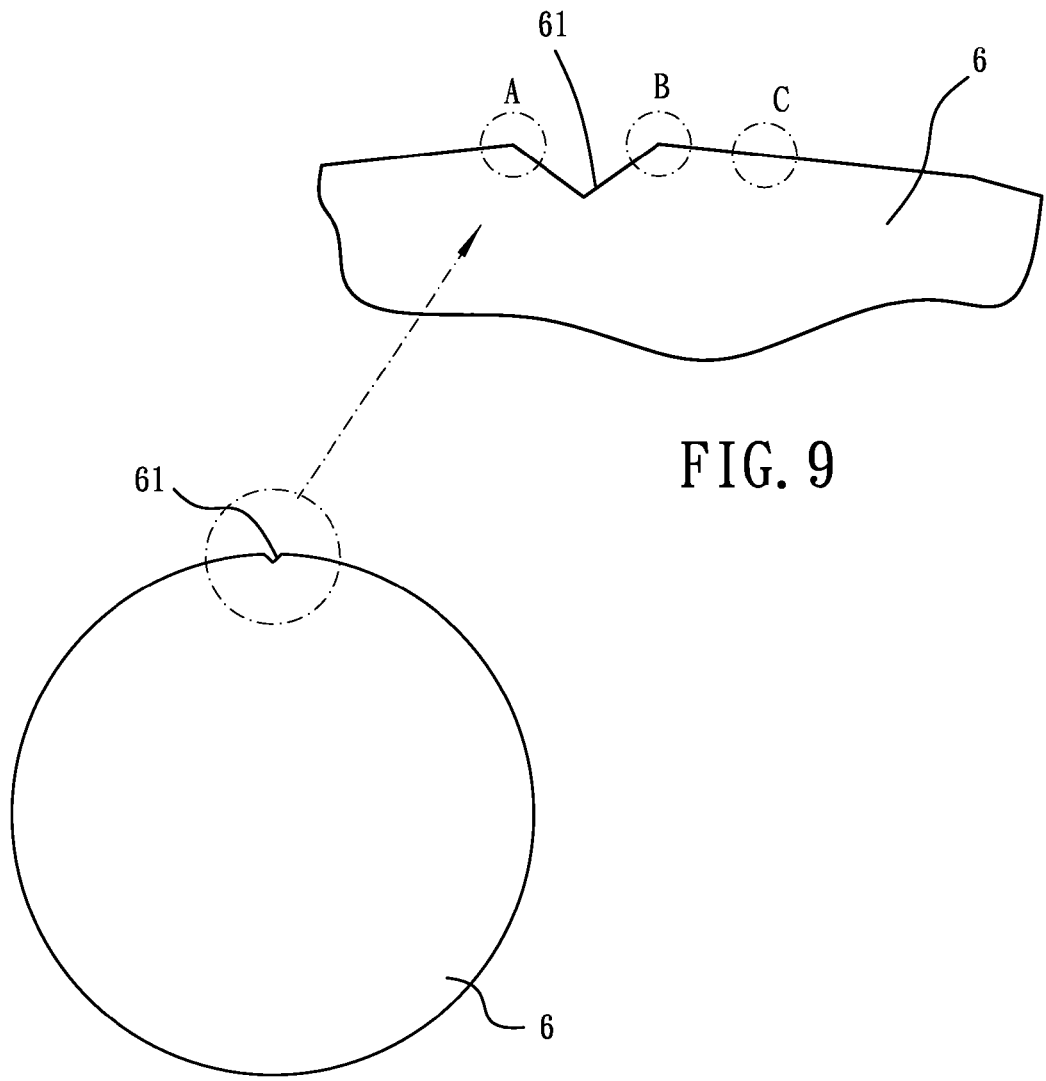
FIG. 8 is a plane view of a cut film of the cutting mechanism for dry film laminator in accordance with the present invention.
FIG. 9 is a partial enlarged plane view of a V-shaped cut in the cut film of the cutting mechanism for dry film laminator in accordance with the present invention in FIG. 8.

As shown in FIGS. 8 and 9, when the blade 411 is driven by the elevating device 43, the motor 42, and the blade-angle adjuster 412 (shown in FIG. 2), the blade 411 would start to penetrate the film 6 at a first cut point A and sequentially penetrates the film 6 at a second cut point B. The first and second cut points A, B configure the V-shaped cut 61 in the film 6 which corresponds to the V-shaped cut (not shown) in the wafer 7. After that, the blade 411 is driven to penetrate the film 6 at a third cut point C. The motor 42 drives the film cutter 41 to rotate along the annular groove 312 for cutting the film 6 into the shape of the outer peripheral edge of the wafer 7.

Afterwards the film cutter 41 moves downwardly and separated from the annular groove 312. The lifting device 33 moves the suction member 31 upwardly with the cut film 6 which is sucked by the suction member 31. The swiveling device 32 swivels the suck member 31 with the cut film 6 from the position above the cutting space 11 to a position above the wafer 7 which is held on the support base 5. The suction member 31 is subsequently moved downwardly with the cut film 6 by the lifting device 33 and releases the cut film 6 onto the wafer 7. Before next cutting, the used film 6 is collected by the take-up spool 22. The unused film 6 is simultaneously guided above the cutting space 11 again.

Although the invention has been explained in relation to its preferred embodiment, it is to be understood that many other possible modifications and variations can be made without departing from the spirit and scope of the invention as hereinafter claimed.

What is claimed is:

1. A cutting mechanism for dry film laminator comprising:
   a main base adapted to be connected to a dry film laminator, the main base having a cutting space defined therein and extending therethrough, the main base having two rollers disposed on a top thereof and oppositely located beside the cutting space, the two rollers adapted to flatly guide a film above the cutting space;
   a film-carrying device movably disposed on the top of the main base, the film-carrying device including a suction member movably disposed thereon, the suction member being able to move downwardly relative to the main base and adapted to suck the film located above the cutting space, the suction member having at least one annular groove defined in a bottom thereof and adapted to correspond to a shape of a wafer; and
   a cutting device movably disposed below the main base and corresponding to a location of the cutting space, the cutting device including a film cutter movably disposed on a top thereof, the cutting device including an elevating device movably disposed thereon and connected to the film cutter for moving the film cutter upward/downward through the cutting space relative to the main base, the cutting device including a motor disposed thereon and connected to the elevating device for rotating the film cutter in the cutting space;
   wherein when the suction member moves downwardly above the cutting space and is adapted to suck the film guided above the cutting space, the film cutter is lifted by the elevating device and penetrates the film to be confined by one of the at least one annular groove in the suction device, the motor driving the film cutter to rotate along the annular groove for cutting the film, the film cutter moving downwardly and separated from the annular groove, the suction member sucking the cut film and moving upwardly with the cut film.

2. The cutting mechanism for dry film laminator as claimed in claim 1, wherein the suction member has a plurality of air holes defined in the bottom thereof, such that the suction member sucks in air via the air holes.

3. The cutting mechanism for dry film laminator as claimed in claim 1, wherein the at least one annular groove are concentrically defined in the bottom of the suction member.

4. The cutting mechanism for dry film laminator as claimed in claim 1 further comprising a support base disposed on the top of the main base for adapting to hold the wafer, the film-carrying device carrying the cut film sucked by the suction member and releasing the cut film on the wafer held on the support base.

5. The cutting mechanism for dry film laminator as claimed in claim 1, wherein the film cutter includes a blade movably mounted thereon, the film cutter including a blade-angle adjuster mounted thereon and connected to the blade for varying an angle of the blade relative to the film cutter, such that the blade is driven by the blade-angle adjuster to make a V-shaped cut in the film corresponding to a V-shaped cut in the wafer.

6. The cutting mechanism for dry film laminator as claimed in claim 1 further comprising a film supply device disposed on a bottom of the main base, the film supply device including a supply spool and a take-up spool disposed thereon and respectively corresponding to the two rollers, the film wound on the supply spool and riding around the two rollers, the take-up spool winding the used film.

7. The cutting mechanism for dry film laminator as claimed in claim 4, wherein the film-carrying device includes a lifting device movably mounted thereon and connected to the suction member for moving the suction member upward/downward relative to the main base, the film-carrying device including a swiveling device movably mounted thereon and swivelably connected to the lifting device for swivelably moving the suction member from the cutting space to the support base.

\* \* \* \* \*